US009058452B1

(12) United States Patent
Chang et al.

(10) Patent No.: US 9,058,452 B1
(45) Date of Patent: Jun. 16, 2015

(54) SYSTEMS AND METHODS FOR TRACING AND FIXING UNKNOWNS IN GATE-LEVEL SIMULATION

(71) Applicant: Avery Design Systems, Inc., Andover, MA (US)

(72) Inventors: Kai-Hui Chang, North Andover, MA (US); Yen-Ting Liu, Kaohsiung (TW); Christopher S. Browy, Boston, MA (US); Chi-Lai Huang, Andover, MA (US)

(73) Assignee: Avery Design Systems, Inc., Tewksbury, MA (US)

( * ) Notice: Subject to any disclaimer, the term of this patent is extended or adjusted under 35 U.S.C. 154(b) by 0 days.

(21) Appl. No.: 14/193,748

(22) Filed: Feb. 28, 2014

Related U.S. Application Data

(60) Provisional application No. 61/814,833, filed on Apr. 23, 2013, provisional application No. 61/861,385, filed on Aug. 1, 2013.

(51) Int. Cl.
*G06F 17/50* (2006.01)

(52) U.S. Cl.
CPC .......... *G06F 17/505* (2013.01); *G06F 17/5081* (2013.01); *G06F 17/5022* (2013.01)

(58) Field of Classification Search
CPC .................................................. G06F 17/5022
USPC .......................................................... 716/106
See application file for complete search history.

(56) References Cited

U.S. PATENT DOCUMENTS

| | | | |
|---|---|---|---|
| 7,673,260 B2* | 3/2010 | Chen et al. ............... | 716/106 |
| 8,402,405 B1 | 3/2013 | Chang et al. | |
| 2004/0194046 A1* | 9/2004 | Singhal et al. ............ | 716/11 |
| 2006/0225009 A1* | 10/2006 | Reddy et al. ............. | 716/4 |
| 2009/0138837 A1* | 5/2009 | Baumgartner et al. .... | 716/6 |
| 2009/0327986 A1* | 12/2009 | Goswami et al. ......... | 716/6 |
| 2010/0017187 A1 | 1/2010 | Hira et al. | |
| 2010/0251199 A1* | 9/2010 | Baumgartner et al. .... | 716/12 |
| 2010/0313175 A1* | 12/2010 | Petlin .......................... | 716/106 |
| 2012/0072876 A1 | 3/2012 | Salz et al. | |
| 2013/0024830 A1* | 1/2013 | Tang et al. ................ | 716/112 |
| 2013/0086539 A1* | 4/2013 | Min et al. .................. | 716/106 |

OTHER PUBLICATIONS

Chang et al., "Improving Gate Level Simulation Accuracy when unkonws exist", Jun. 3, 2012, ACM, pp. 1-5.*
Choe et al., "Finding reset nondeterminism in RTL designs—Scalable X-analysis methodology and case study", 2010, EDAA. pp. 1-6.*
Chang, et al., "Handling Nondeterminism in Logic Simulation So That Your Waveform Can Be Trusted Again", "D & T Early Access". . Publisher: IEEE, Published in: US Mar. 7, 2013.

* cited by examiner

*Primary Examiner* — Stacy Whitmore
(74) *Attorney, Agent, or Firm* — Loginov & Associates, PLLC; William A. Loginov

(57) ABSTRACT

A computer executable tool analyzes unknowns (Xs) in gate-level simulation and traces their sources to determine if the Xs are generated due to X-pessimism. For Xs generated due to X-pessimism, fixes are generated to correct simulation results. Corrected simulation results match real hardware behavior and greatly reduce the analysis effort of engineers.

9 Claims, 11 Drawing Sheets

```
always @(g1.o or reg1.q or g2.o)
if (g1.o === 1'b1 && reg1.q === 1'bx &&
    g2.o === 1'b1)
        force g6.o= 1'b0;
else
        release g6.o;
```

Fig. 4

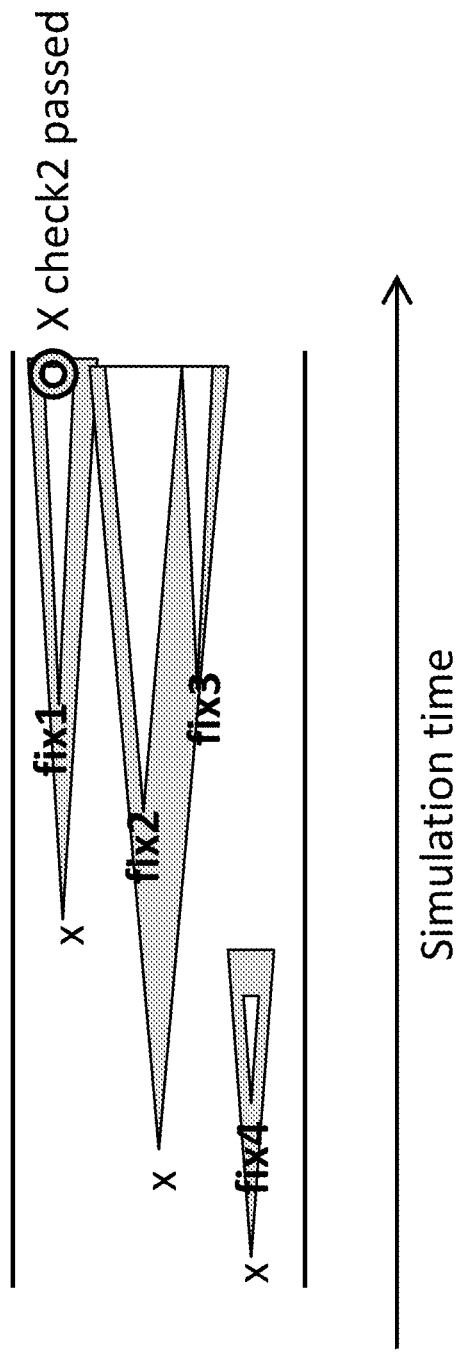

SYSTEMS AND METHODS FOR TRACING AND FIXING UNKNOWNS IN GATE-LEVEL SIMULATION

RELATED APPLICATIONS

This application claims the benefit of U.S. Provisional Application Ser. No. 61/814,833, filed Apr. 23, 2013, entitled METHODS FOR TRACING AND FIXING UNKNOWNS IN GATE-LEVEL SIMULATION, the entire disclosure of which is herein incorporated by reference, and this application also claims the benefit of U.S. Provisional Application Ser. No. 61/861,385, filed Aug. 1, 2013, entitled SYSTEMS AND METHODS FOR TRACING AND FIXING UNKNOWNS IN GATE-LEVEL SIMULATION, the entire disclosure of which is herein also incorporated by reference.

FIELD OF THE INVENTION

The present invention relates generally to integrated circuit design and, more particularly, to techniques for tracing unknowns (Xs) and generating fixes to eliminate false Xs generated by X-pessimism in gate-level logic simulation.

BACKGROUND OF THE INVENTION

Gate-level simulation is used extensively to verify the correctness of design netlists. Typically, input stimuli are applied to the netlist, and the simulation results are compared with a golden model or pre-defined checkers. When unknown values (Xs) exist, however, gate-level simulation can no longer produce correct results due to X-pessimism. Reference is now made to FIG. 1 showing a schematic diagram of an exemplary design netlist in which X-pessimism occurs. As FIG. 1 shows, the output of gate g4 should be 1 but logic simulation produces X instead. Such inaccuracy can produce numerous false Xs, rendering gate-level simulation useless. This problem is becoming severe due to physical optimizations and low-power requirements that allow Xs to exist in the design.

One simple prior art solution to the problem is to deposit random values at registers, such as the work by Hira et al., in U.S. Published Patent Application No. 2008/000950, entitled "Random Initialization of Latches in an Integrated Circuit Design for Simulation". Such an approach eliminates X problems by converting the Xs into non-X values. However, each deposited value only represents one of the two possible values that the register can have. This can disadvantageously cause bugs to escape verification.

To properly fix gate-level simulation, the first step is to find false Xs produced during simulation. The earlier work of Chang et al., "Handling Nondeterminism in Logic Simulation So That Your Waveform Can Be Trusted Again", *IEEE D&T Early Access*, 2011, proposed a formal technique and a methodology that can find false Xs generated during simulation. However, this solution to fix the problem is not generic. More specifically, this solution forces the correct values to the registers at the simulation time when the formal analysis was applied. This solution solves the problem at the particular time but does not resolve subsequent false Xs that may occur.

Oleg, in United States Published Patent Application No. 2010/0313175, entitled "Verification Systems and Methods", proposed a technique to find X sources as well as the locations where such Xs can be trapped. However, he did not provide solutions on how to use the analysis to fix gate-level logic simulation for improved accuracy. In addition, his method analyzes all possible paths for X-propagation, requiring significant amounts of search space to be utilized.

Salz et al, in United States Published Patent Application No. 2012/0072876, entitled "Method and Apparatus for Reducing X-pessimism in Gate-level Simulation and Verification: proposed to resolve false Xs in gate-level simulation by duplicating a portion of the circuit (called a sub-circuit) and replacing Xs with 0 or 1 values to see if the output of the sub-circuit becomes 0 or 1. If so, the X is false. In their work, they required the user to indicate where X-pessimism may occur so that the analysis can be performed. However, identifying such logic is extremely difficult in practice. In addition, duplicating the sub-circuit to find false Xs is not only time-consuming but also requires a large mount of memory.

SimXACT Technique for Fixing X-Pessimism Issues

The prior U.S. Pat. No. 8,402,405 to Chang, et al, entitled SYSTEM AND METHOD FOR CORRECTING GATE-LEVEL SIMULATION ACCURACY WHEN UNKNOWNS EXIST, formally analyzes the trace to find fixes that can eliminate all combinational false Xs encountered during the simulation of the trace. The inputs to SimXACT are a trace as input stimuli, a gate-level netlist, and a start time that the Xs should be checked for the first time to determine whether they are false or not. The output is auxiliary code that when the same X-pessimism conditions are encountered, those false Xs will be replaced with the correct values.

SimXACT Works as Follows:

(1) At the start time, a check of the register data inputs is performed to check for Xs in the registers (typically denoted as "d") to determine if they are false. The function used to check for Xs is shown below in table 1:

TABLE 1

| function checkX(input d, output subckt); |
|---|
| 1    pi_frontier ← d; |
| 2    while (pi_frontier not empty) |
| 3        var ← pi_frontier.pop( ); |
| 4        gate ← var.get_fanin_gate( ); |
| 5        subckt ← subckt ∪ gate; |
| 6        foreach input ϵ gate.get_inputs( ) |
| 7            if (input.value = x && |
|                  input ∉ {design inputs,register outputs}) |
| 8                pi_frontier ← pi_frontier ∪ input; |
| 9    return proveX (subckt); |

As shown, at line 1 of the illustrative code listing, the input d is inserted into pi_frontier, which is a set of inputs to the fan-in cone logic collected in subckt (the sub-circuit) thus far. The fan-in cone is then expanded by popping a variable, var, from pi_frontier (in line 3) and get the gate, gate, that fans out to the variable in line 4. The gate is then added to the sub-circuit, subckt, in line 5. In line 6, the inputs of gate are verified, or checked, and an input to pi_frontier is added if (1) the input has an X value in logic simulation, and (2) the input is not the primary input or a register output. The second condition stops fan-in extraction at register boundaries, rendering the analysis combinational. Line 9 calls the function proveX to prove whether the X in the sub-circuit's (subckt's) output, d, is real.

(2) For each false X, the fan-in cone of the register input is traced to find a portion of the cone, called a sub-circuit, whose inputs have real Xs and whose output is a false X. Algorithms ckt_minimize1, in table 2 below, and ckt_minimize2, in table 3 below, are used to achieve this goal.

TABLE 2

| function ckt_minimize1(input subckt,output subckt$_n$); |
|---|
| 1    new_po ← subckt.get_output( ); |

TABLE 2-continued

```
2        subckt_n ← subckt;
3        do
4            gate ← new_po.get_fanin_gate( );
5            c_po ← new_po;
6            foreach input ∈ gate.get_inputs( )
7                subckt_input ← fanin cone of input in subckt;
8                if (input.value = x &&
                     proveX (subckt_input) = false)
9                    new_po ← input;
10                   subckt_n ← subckt_input;
11           if (c_po = new_po)
12               break;
13       return;
```

The function shown above in Table 2 initiates using the original output of the sub-circuit from the X checking process, checkX above, and traces the Xs in its fan-in cone until a real X is reached. The last false X then becomes the new output of the sub-circuit, subckt$_n$, that also eliminates Xs. Note that during the tracing step, if there is more than one input that has a false X for a given gate, the illustrative procedure picks the first one (i.e. lines 6-8 of the code listing above). Accordingly, more than one iteration can be employed to eliminate all the false Xs, due to the X-eliminating sub-circuit now eliminating the X only at the chosen input. Accordingly, after a fix is found, the X in the fixed variable is replaced with its non-X value and logic simulation is performed on the original fan-in cone of the input d. Then d is verified to determine if it is X. If d is X, then the same repair analysis is performed again, and desirably repeats until d is no longer X. Thus, the false X at d is successfully and advantageously repaired by the fixes generated for its fan-in cone.

The code below in Table 3 is an example of a process for minimizing an X-elimination sub-circuit by moving its primary inputs towards its output. The input to the process is a sub-circuit, which is the sub-circuit (subckt$_n$) returned by the first tracing process described above, for tracing the fan-in of false Xs to reduce the X-elimination sub-circuit from the output. The output of the second process for moving the input is a new sub-circuit saved as subckt$_n$.

TABLE 3

```
function ckt_minimize2(input subckt, output subckt_n);
1        subckt_n ← subckt;
2        do
3            changed= false;
4            foreach gate connected to subckt_n.get_inputs( );
5                subckt_n ← subckt_n \ gate;
6                if (proveX (subckt_n) = false)
7                    changed = true;
8                    break;
9                else
10                   subckt_n ← subckt_n ∪ gate;
11           while (changed);
12       return;
```

In line 1 of the exemplary program code function/process, the sub-circuit, subckt, is copied to the new sub-circuit, subckt$_n$. In lines 4-10 of the illustrative function, each gate that connects to the primary inputs of the new sub-circuit, subckt$_n$, is removed to determine whether the output is still a false X. If the X is still false, the change is kept (lines 6-8). Otherwise, the gate is added back (line 10). This process repeats until no further gates can be removed (the do-while loop of lines 2-11 above). The inputs of the sub-circuit have now been moved as close to its output as possible.

(3) Generate false X elimination solution and auxiliary code based on the sub-circuit to eliminate such Xs.

(4) The generated fixes are applied by auto-fix to repair the current simulation values. Auto-monitor is then turned on to find further Xs that need to be checked throughout simulation.

After the analysis of the trace is finished, the generated auxiliary code can be used with future simulation to eliminate the false Xs. This flow allows gate-level simulation to produce correct results.

Auto-fix is used in the procedures to apply the generated fixes to repair simulation results instantly. Auto-fix works as follows: whenever a fix is generated dynamically during the SimXACT run, the procedure begins monitoring the simulation values of the fix conditions and deposits the non-X value to replace the false X on the target variable when the conditions match. When the values no longer match the conditions, the force is released. This can be implemented via the programming interfaces of modern simulators.

Auto-monitor examines simulation activities and applies X analysis to variables that can potentially have false Xs. More specifically, it monitors the gate-level simulation values on the fan-in cone of a register D input and checks for false Xs when the values in its fan-in cone change and the D input has an X value. In other words, a variable is checked again if the variable has an X value and the variables of its fan-in cone have value changes. This can also be implemented via the programming interfaces of modern simulators.

SimXACT analysis is comprehensive and is guaranteed to produce correct simulation results that match real hardware. However, sometimes the user only needs a small number of the generated fixes to make the test pass. In other words, many of the fixes, although effectively eliminating false Xs, are not needed as they do not affect test results.

SUMMARY OF THE INVENTION

The present invention overcomes the disadvantages of the prior art by analyzing the sequential fan-in cones of one or more given variables with X values and generating fixes to eliminate false Xs in the cones. The fixes allow logic simulation to produce correct simulation values for the given variables that originally have Xs, making it easy for designers to determine if the Xs are bugs or not.

In an illustrative embodiment, the system comprises an X-tracing simulation tool that receives a waveform, a design netlist and variables with Xs and associated times, and performs an X-tracing analysis by tracing at least one X backward, and outputting zero or one or more X-pessimism fixes as auxiliary code. The fixes are implemented and after re-simulation, if the X is resolved, the analysis is complete, and if the X remains, further analysis is needed.

In an illustrative embodiment, the method comprises the steps of performing a first logic simulation of a test trace of a waveform, resulting in test failure due to Xs, specifying one ore more variables to be analyzed and a time those variables have unexpected Xs, tracing sequential fan-in cones of the variables based on the waveform and generating fixes when false Xs exist in the fan-in cones, and performing a second logic simulation of the test trace with the generated fixes as an auxiliary code to determine if Xs in the variables are eliminated. The process is repeated until Xs are eliminated or no more fixes are generated. The analysis is complete if the Xs are eliminated, and further analysis is required if the Xs are not eliminated.

The step of tracing sequential fan-in cones of the variables can be performed by adding variables to be analyzed and a simulation time that the variables have unexpected Xs into a storage element, obtaining a variable and the associated simulation time from the storage element, and setting a current waveform time to the associated simulation time, tracing the fan-in cone of the variable until predetermined cutpoints are reached, reading values of cutpoint variables from the waveform at the waveform time, and depositing values into the simulator, analyzing fan-in cone of the variable and determine if the X is false, and generate fixes when the X is false, tracing the Xs, if the Xs is real, starting from the variable, to locate registers in the fan-in cone that contain Xs, and for each register found in tracing the Xs: (i) if a found X comes from synchronous input, determine a clock pin and a clock edge that latched the found X, and add the input and the clock edge time into the storage element, and (ii) if a found X comes from an asynchronous input, locate a time an input changed to X and add the input and the time into the storage element.

BRIEF DESCRIPTION OF THE DRAWINGS

The invention description below refers to the accompanying drawings, of which:

FIG. 4 is an example of code generated to fix the X-pessimism issues, in accordance with an illustrative embodiment, in which the output port of a combinational gate is named "o";

FIG. 11 is a diagram showing that X check2 in a different test can still pass because SimXACT already generated the required fix (fix1), in accordance with an illustrative embodiment.

DETAILED DESCRIPTION

Overall System and Method

Figure 1:
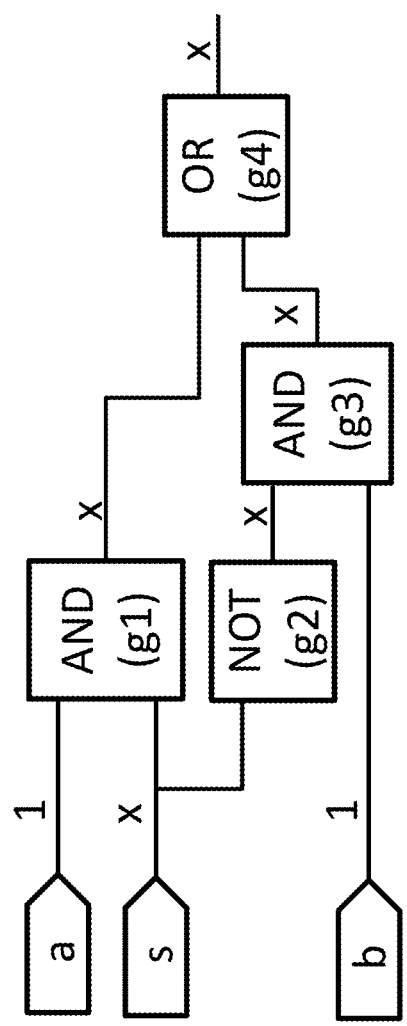
FIG. 1, already described, is a schematic diagram of an exemplary design netlist in which X-pessimism occurs, according to an illustrative embodiment.
Figure 2:
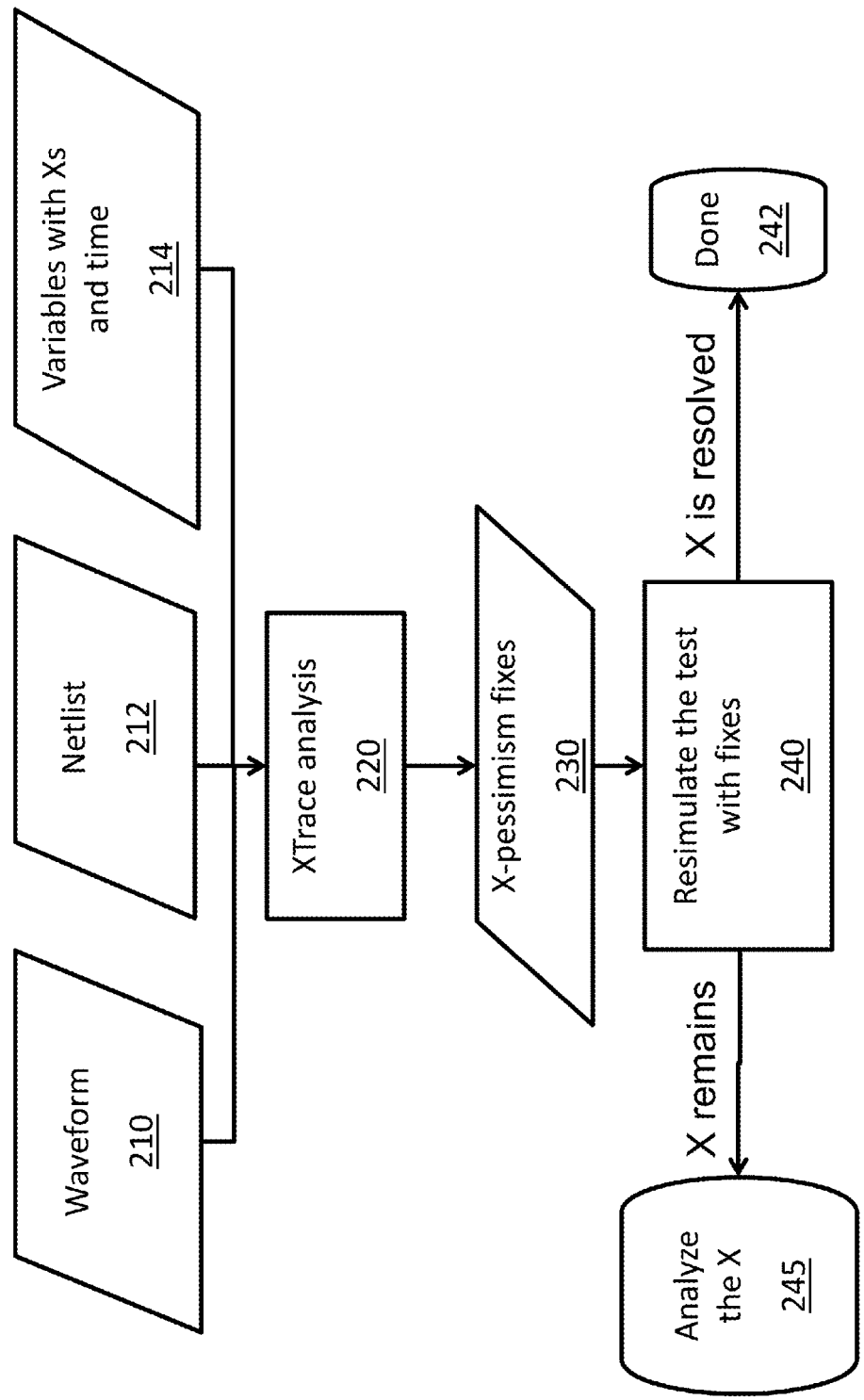
FIG. 2 is a block diagram of an overall system for tracing unknowns and fixing X-pessimism issues in gate-level simulation, according to an illustrative embodiment.

The systems and methods herein fix gate-level simulation when Xs exist by employing XTrace analysis (an X-tracing procedure or X-tracing computer executable simulation tool that traces backwards to locate false Xs). Reference is made to FIG. 2 showing a block diagram of an overall system for tracing unknowns and fixing X-pessimism issues in gate-level simulation, according to an illustrative embodiment. The inputs to the tool are a waveform file 210 from simulating a test trace, a gate-level netlist 212, and a set of variables 214 that have unexpected X values which need to be analyzed. The output of the XTrace analysis 220 is auxiliary-code as X-pessimism fixes 230 that, when executed with the testbench, the false Xs in the fan-in cones of the given variables will be replaced with the correct values in logic simulation. The fixes allow logic simulation to produce correct simulation values for the given variables. After resimulating the test with the fixes at step 240, it is determined whether the X remains. If the Xs in the given variables are caused by false Xs in their fan-in cones, the Xs will be replaced with non-X values, and thus at step 242 the analysis is complete. Otherwise, the Xs are real and need further investigation at step 245. In this manner, engineers can easily determine whether the Xs are true bugs or not.

The code used in FIG. 2 item 230 can be in Verilog, SystemVerilog or VHSIC Hardware Description Language (VHDL) or languages that can control logic simulation such as Tcl, Perl, C, SystemC, C++, and others known to those of ordinary skill in the art.

Figure 3:
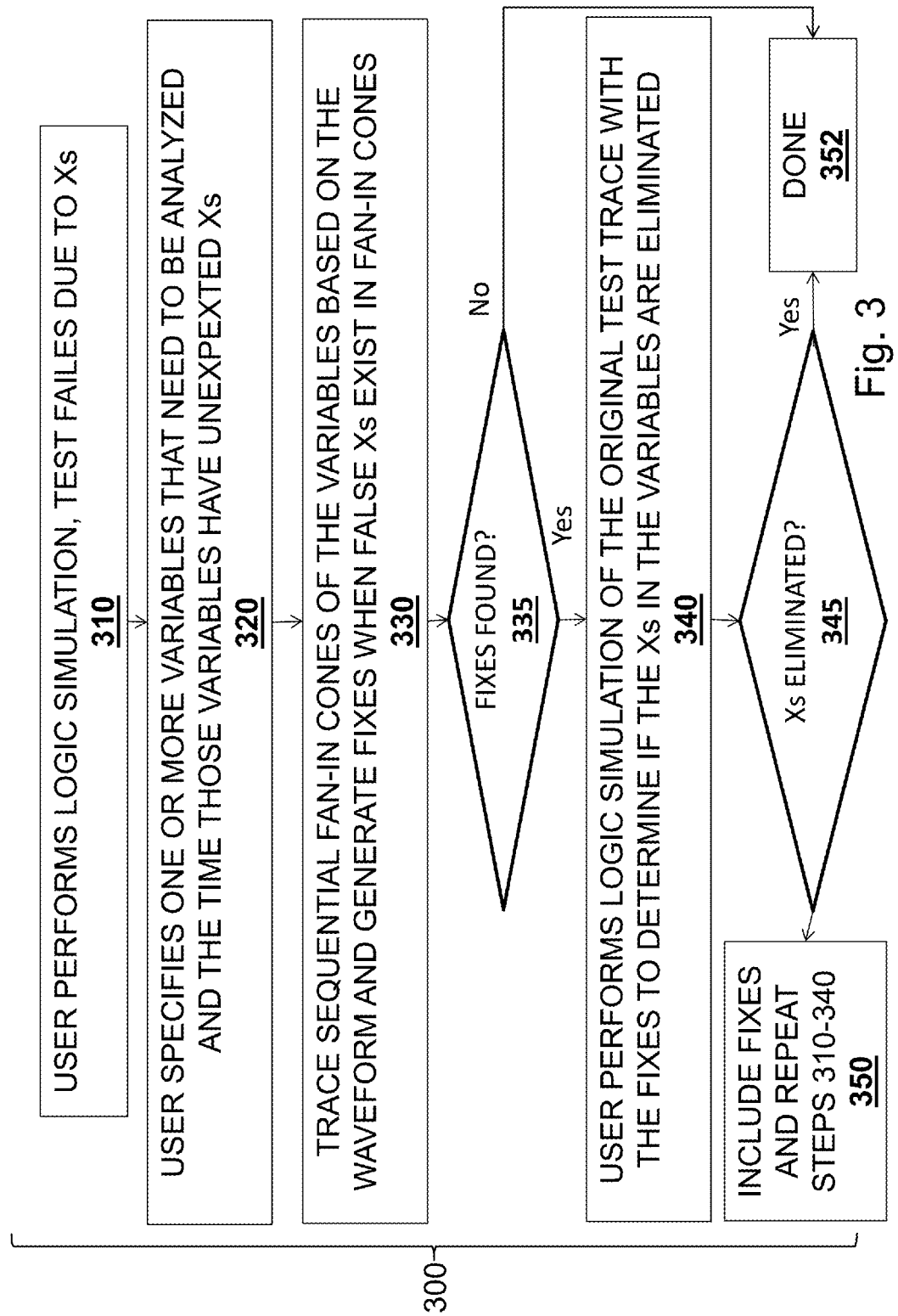
FIG. 3 is a flow chart of the overall procedure for tracing and fixing an X, in accordance with an illustrative embodiment.

In accordance with the illustrative embodiments, FIG. 3 shows a flow chart of the overall procedure 300 for tracing and fixing an X. At step 310, the user performs logic simulation on a test to dump a waveform, and the test failed due to Xs. At step 320, the user specifies one or more variables which need to be analyzed and the time that those variables have unexpected Xs. At step 330, the analysis traces the sequential fan-in cones of the variables based on the waveform and generates fixes whenever the false Xs are encountered in the fan-in cones. At step 335, the analysis determines if new fixes are generated. If no new fixes are generated, then the analysis is done. At step 340, the user performs logic simulation of the original test trace with the fixes to see if the Xs in the given variable are eliminated or not. At step 345, the analysis determines whether the Xs are eliminated. If the Xs are eliminated, the analysis is done. If the Xs are not eliminated and more fixes are found, at step 350, the generated fixes are included and steps 310-340 are repeated until false Xs are eliminated or no more fixes can be found. After the analysis finishes, at step 352, if the Xs are eliminated in the logic simulation of the test trace, then the Xs are caused by false Xs and are not bugs. If not, then the Xs are real and further analysis is required to determine if the Xs will cause issues.

FIG. 4 is an example of code generated to fix the X-pessimism issues, in accordance with an illustrative embodiment, in which the output port of a combinational gate is named "o".

Identifying False Xs and Generating Fixes

Figure 5:
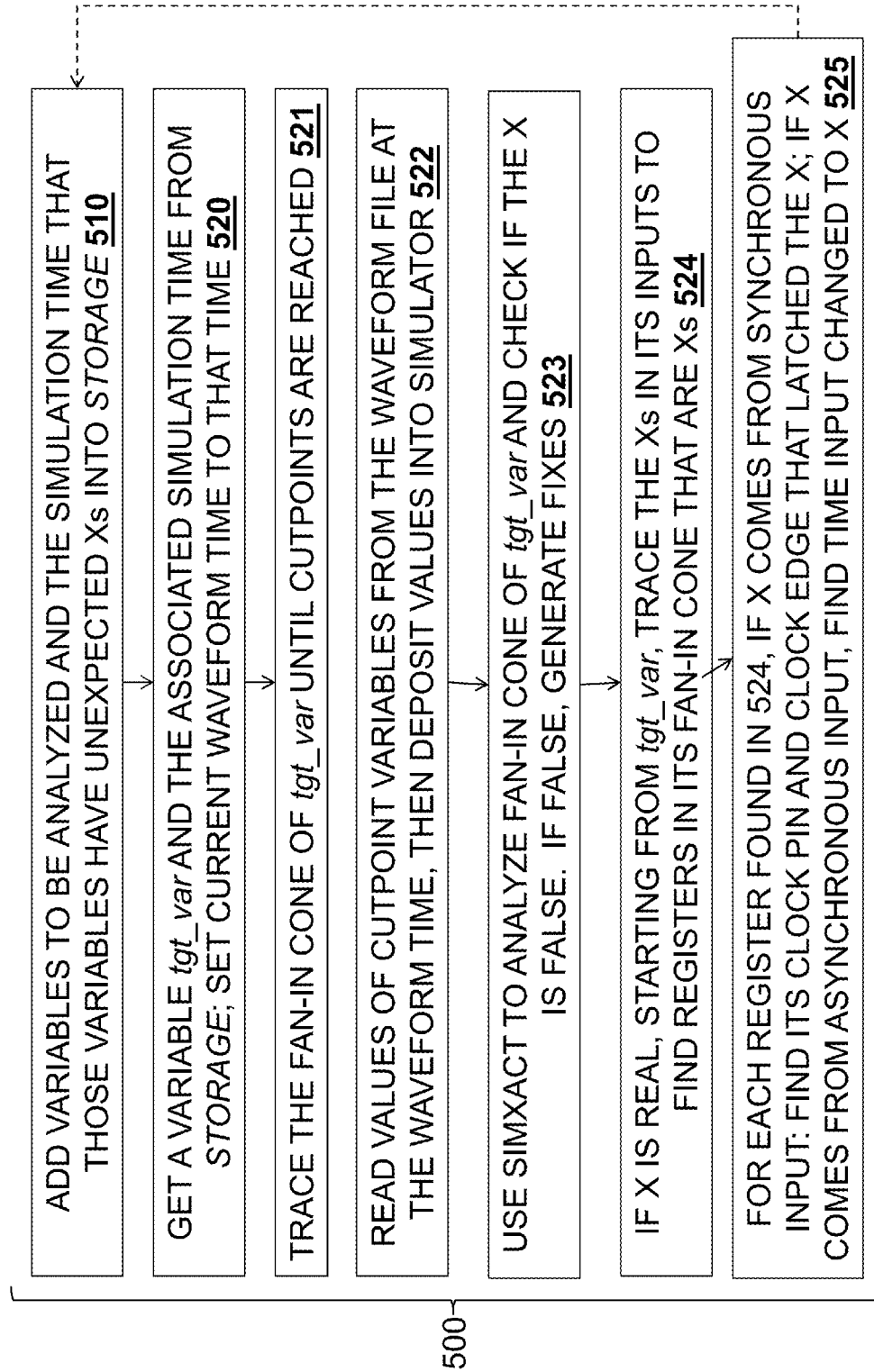
FIG. 5 a flow chart of an exemplary procedure for identifying false Xs, at step 330 of FIG. 3, in accordance with an illustrative embodiment.

Reference is made to FIG. 5 showing a flow chart of an exemplary procedure 500 for identifying false Xs, at step 330 of FIG. 3, in accordance with an illustrative embodiment. At step 510, the procedure adds variables to be analyzed and the simulation time that those variables have unexpected Xs into a variable or element for holding such information called storage. At step 520, the procedure retrieves a variable, called tgt_var, and the associated simulation time from storage, and the current waveform time is also set to that time. At step 521, the fan-in cone of tgt_var is traced until cutpoints (outputs of registers, primary inputs, testbench variables, etc.) are reached. At step 522, the procedure reads values of cutpoint variables from the waveform file at the waveform time, then deposit the values into the simulator. The simulator simulates those deposited values to reproduce the fan-in cone values for tgt_var at the waveform time. At step 523, the SimXACT technique is implemented, as described in U.S. Pat. No. 8,402,405, as functions checkX, ckt_minimize1 and ckt_minimize2; also shown as table 1, table 2 and table 3 from the background section of this application. The SimXACT technique at step 523 analyzes the fan-in cone of tgt_var and checks if the X is false. If it is false, it generates fixes. At step 524, if the X is real, starting from tgt_var, the procedure traces the Xs in its inputs to find registers in its fan-in cones that are Xs. At step 525, for each register found in step 524, if its X comes from its synchronous input, determine its clock pin, and then find the clock edge that latched the X into the register using the waveform. Then add the register's input and the clock edge time into storage. If the X comes from the register's asynchronous input, find the time that the input's value changed to X, and then add the input and the time into storage. At step 530, the procedure is repeated until storage is empty or a user specified termination criterion is encountered.

In accordance with the procedure 500, storage can be implemented in many different ways in accordance with ordinary skill. For example, a priority queue with larger time having higher priority can be implemented. When a priority queue is used, the search will proceed reverse-chronologically, making it easy to check X back-tracing progress and analyze trace results. Another option is to use a regular queue. A regular queue causes the back-tracing to use Breadth-First-Search (BSF) based on the number of cycles. In some cases BFS will find X-pessimism issues faster than using a priority queue. Note that the two examples of storage implementations are only examples and do not limit the invention from other implementations such as stacks, heaps, and other implementations readily applicable to those of ordinary skill in the art.

To reduce runtime, the user can refine or "prune" the analysis based on the time period that will be analyzed or by the number of fixes that will be generated. They are called "termination criteria" described with reference to the algorithm of FIG. 5.

To reduce analysis effort, the auto-fix technique described in U.S. Pat. No. 8,402,405 can be applied. When the values deposited from the waveform caused a fix to match current simulation values, an existing fix will be automatically applied to remove the false X, thus reducing analysis effort.

Force commands can be used to deposit a value from the waveform into the simulator, in Verilog simulators, Programming Language Interface (PLI) or Verilog Procedural Interface (VPI) can be used. However, any interface that can control the behavior of the simulator with similar functionality can be used. After the analysis of a variable is complete, those values should be released.

Advantages of XTrace

The SimXACT system and method of the U.S. Pat. No. 8,402,405 has several advantages, however it also disadvantageously generates more fixes than necessary for the test to pass, and also requires a longer runtime.

XTrace back traces the given variables with Xs and generates fixes for X-pessimism problems found in their fan-in cones. The advantages are that fewer fixes are needed, because only fixes related to the given Xs will be generated. The systems and methods are applicable when a user knows where unexpected Xs occur for XTrace to start back-tracing. In general, XTrace is suitable for focused X analysis or debugging.

Exemplary Diagrams of SimXACT Analysis and XTrace Analysis

Figure 6:
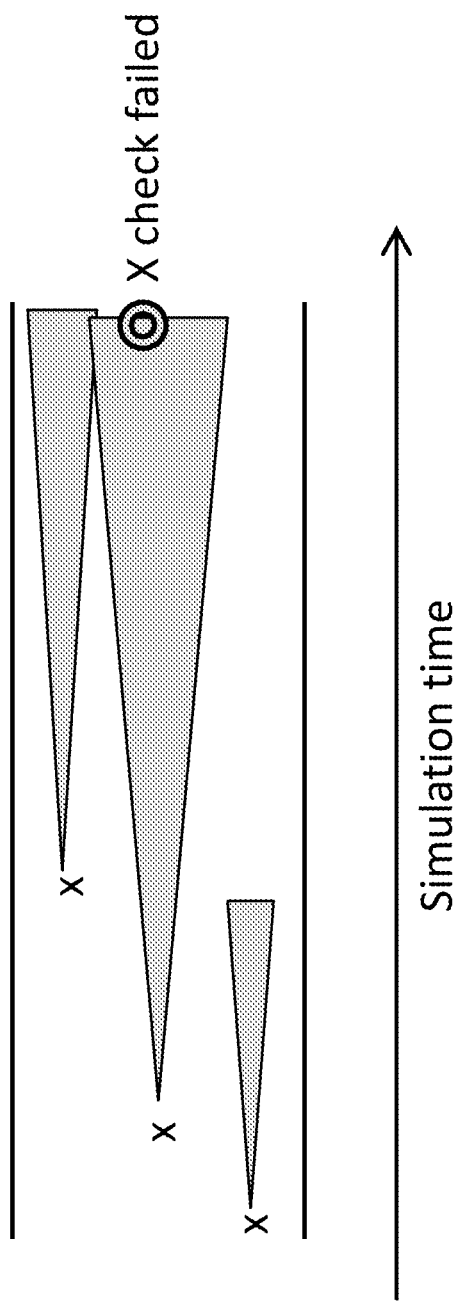
FIG. 6 is a diagram of an example where several Xs propagated out and corrupted registers when simulation proceeds, with shaded areas representing registers that have Xs, in accordance with an illustrative embodiment.
Figure 7:
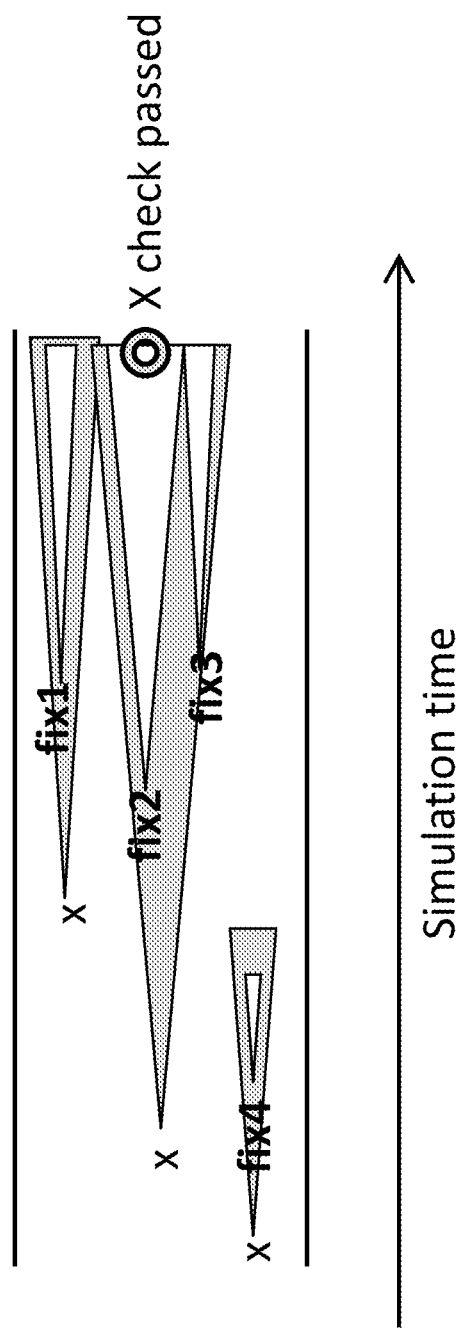
FIG. 7 is a diagram showing that SimXACT can generate fixes to eliminate false Xs caused by X-pessimism, thus reducing the number of registers that are corrupted, as shown by the white area that is created within the shaded area, in accordance with an illustrative embodiment.

FIG. 6 is a diagram of an example where several Xs propagated out and corrupted registers when simulation proceeds, with shaded areas representing registers that have Xs, in accordance with an illustrative embodiment. FIG. 6 shows a test that failed due to an X check finding an unexpected X. When simulating the test, there are several X sources whose Xs corrupt several other registers, but only one of them is responsible for the failed X check. FIG. 7 is a diagram showing that SimXACT can generate fixes to eliminate false Xs caused by X-pessimism, thus reducing the number of registers that are corrupted, as shown by the white area that is created within the shaded area, in accordance with an illustrative embodiment. FIG. 7 shows the results after running SimXACT to analyze the test, which found four X-pessimism fixes. Since fix2 fixed the false X that caused the check to fail; now the test passes. However, SimXACT also generated fixes (fix1, fix3 and fix4) that eliminated the false Xs but are not necessary to make the test pass.

Figure 8:
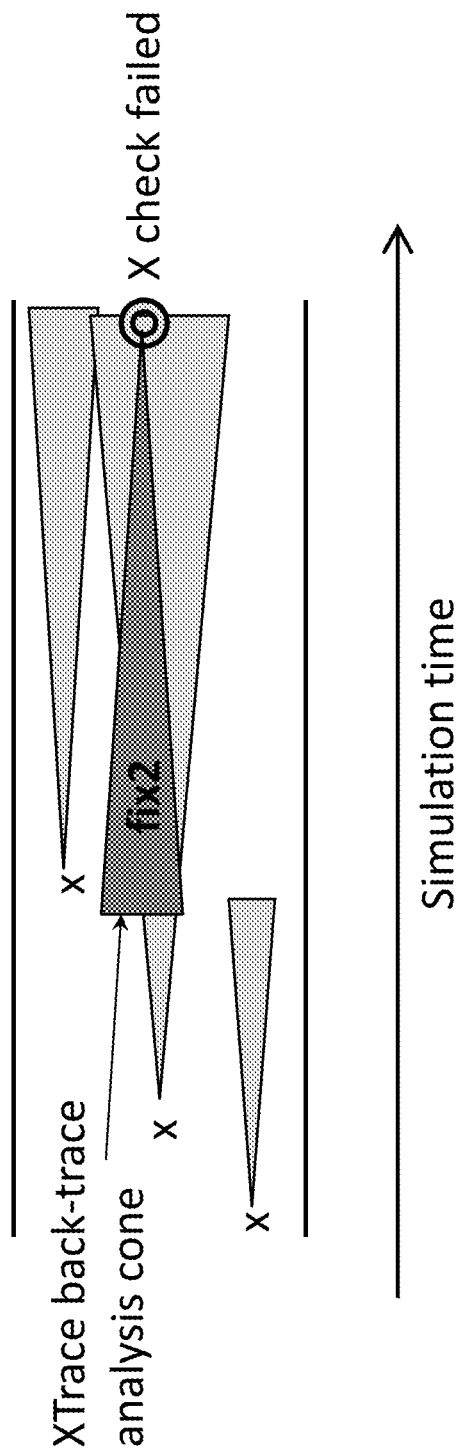
FIG. 8 is a diagram showing that XTrace back traces from the failed X check and found a fix (fix2) in its fan-in cone, in accordance with an illustrative embodiment.
Figure 9:
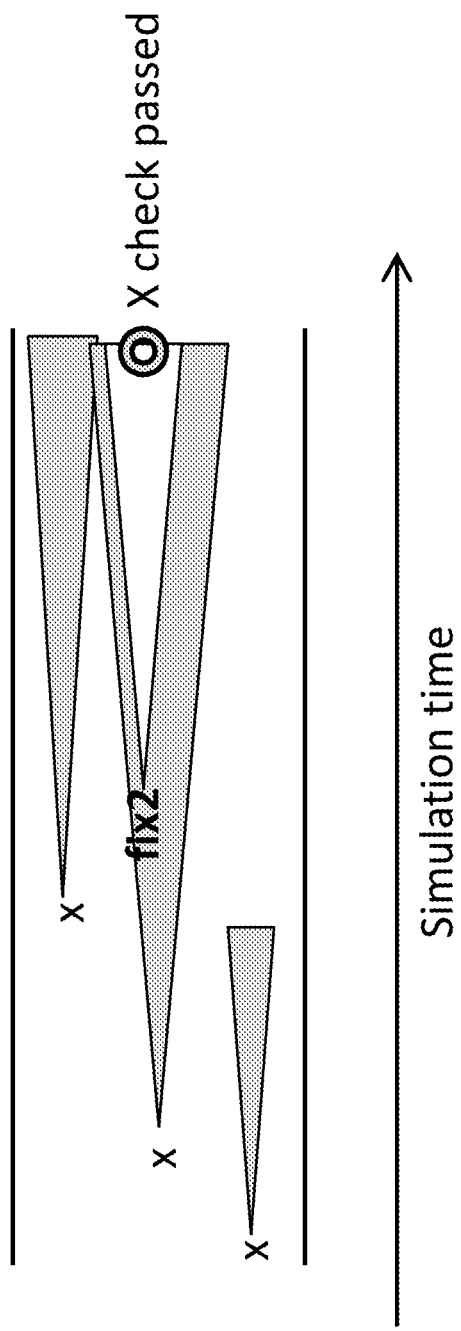
FIG. 9 is a diagram showing that the X check passed with the fix found by XTrace, in accordance with an illustrative embodiment.
Figure 10:
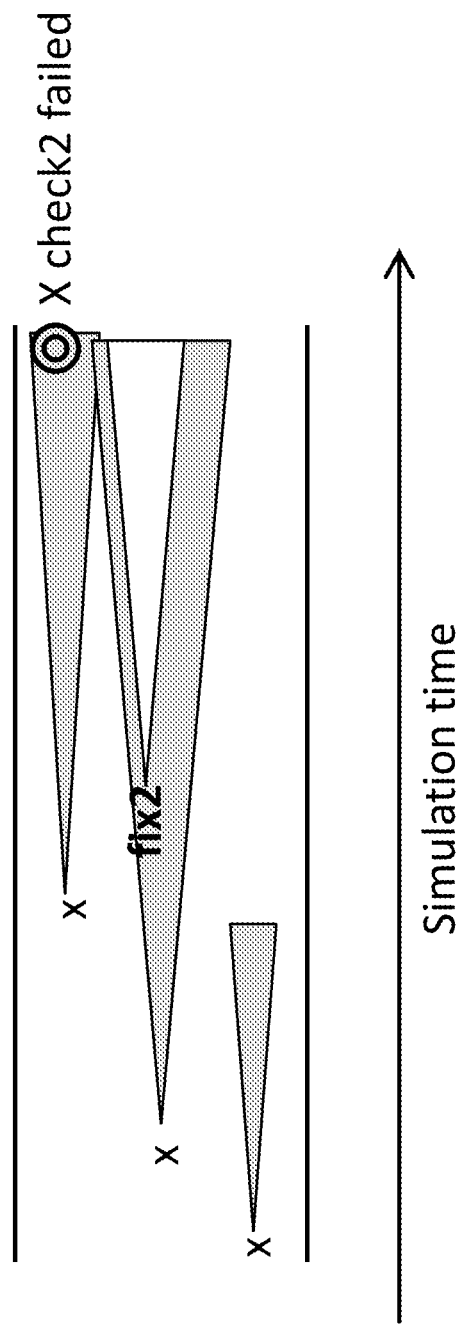
FIG. 10 is a diagram showing that, for a different test, X check2 failed because the fix (fix2) found by XTrace cannot eliminate the false X in the fan-in cone of X check2, in accordance with an illustrative embodiment.

FIG. 8 is a diagram showing that XTrace back traces from the failed X check and found a fix (fix2) in its fan-in cone, in accordance with an illustrative embodiment. FIG. 8 shows that XTrace back-tracing from the failed X check only found one fix (fix2) in its sequential fan-in cone. FIG. 9 is a diagram showing that the X check passed with the fix found by XTrace, in accordance with an illustrative embodiment. FIG. 9 shows that fix2 successfully repaired the false X and made the test pass. However, for a different test as shown in FIG. 10, X check2 failed because the required fix to eliminate the false X is not generated by XTrace. FIG. 10 is a diagram showing that, for a different test, X check2 failed because the fix (fix2) found by XTrace cannot eliminate the false X in the fan-in cone of X check2, in accordance with an illustrative embodiment.

FIG. 11 is a diagram showing that X check2 in a different test can still pass because SimXACT already generated the required fix (fix1), in accordance with an illustrative embodiment. SimXACT already found fix1 that fixed the X-pessimism issues, allowing X check2 to pass as shown in FIG. 11.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, while one X-pessimism example is shown for illustrative purposes, any design netlist can be employed in accordance with the teachings herein. Additionally, while particular exemplary code is shown and described for illustrative purposes, the auxiliary code generated in accordance with embodiments herein is highly variable within ordinary skill to achieve X tracing and fix generation for gate-level simulation. Also, where a "mean" is referenced, it should be taken to include a particular functional component, element, process or processor described herein, or various combinations of (all or part of) a plurality of components, element, processes or processors described herein. Accordingly, this description is meant to be taken only by way of example, and not to otherwise limit the scope of this invention.

What is claimed is:

1. A system for tracing and fixing unknowns (Xs) in gate-level simulation, the system comprising:
   an X-tracing simulation processing component that receives a waveform from a first logic simulation, a design netlist and variables with Xs and time and performs an X-tracing analysis by tracing at least one X backward, and outputting zero or one or more X-pessimism fixes as an auxiliary code;
   a resimulation processing component that implements the zero or one or more X-pessimism fixes and performs a second logic simulation based upon the implemented X-pessimism fixes, wherein the logic simulation indicated at least one of: the X-tracing analysis is complete, and further X-tracing analysis is needed.

2. The system as set forth in claim 1 wherein the auxiliary code is in Verilog, SystemVerilog, VHDIC Hardware Description Language (VHDL) or a language that controls logic simulation comprising at least one of Tcl, Perl, C, SystemC or C++.

3. The system as set forth in claim 1 wherein the X-tracing analysis performs the tracing of at least one X backward by tracing sequential fan-in cones of the variables based on the waveform and generating fixes when false Xs exist in the fan-in cones.

4. The system as set forth in claim 1 further comprising a storage element that stores variables and simulation times when the variables have unexpected Xs.

5. The system as set forth in claim 4 wherein the storage element comprises a priority queue.

6. The system as set forth in claim 4 wherein the storage element comprises a regular queue that uses a breadth-first-search based on a number of cycles.

7. A computer-implemented method for tracing and fixing unknowns (Xs) in gate-level simulation, the method comprising the steps of:
   performing a first logic simulation of a test trace of a waveform, resulting in test failure due to Xs;
   specifying one or more variables to be analyzed and a time those variables have unexpected Xs;
   tracing, via a processor, sequential fan-in cones of the variables based on the waveform and generating fixes when false Xs exist in the fan-in cones;
   performing a second logic simulation of the test trace with the generated fixes as an auxiliary code;
   determining whether Xs in the variables are eliminated; and;
   indicating at least one of: the tracing analysis is complete and further tracing analysis is required.

8. The method as set forth in claim 7 wherein the step of tracing sequential fan-in cones of the variables is performed by:
   adding variables to be analyzed and a simulation time that the variables have unexpected Xs into a storage element;
   obtaining a variable and the associated simulation time from the storage element, and setting a current waveform time to the associated simulation time;
   tracing the fan-in cone of the variable until predetermined cutpoints are reached;
   reading values of cutpoint variables from the waveform at the waveform time, and depositing values into the simulator;
   analyzing fan-in cone of the variable and determine if the X is false, and generate fixes when the X is false;
   tracing the Xs, if the Xs is real, starting from the variable, to locate registers in the fan-in cone that contain Xs; and
   for each register found in tracing the Xs:
   If a found X comes from synchronous input, determine a clock pin and a clock edge that latched the found X, add the register's input and the clock edge time into the storage element; and
   If a found X comes from an asynchronous input, locate a time an input changed to X, and add the input and the time into the storage element.

9. The method as set forth in claim 7 wherein the auxiliary code is in Verilog, SystemVerilog, VHDIC Hardware Description Language (VHDL) or a languages that controls logic simulation comprising at least one of Tcl, Perl, C, SystemC or C++.

* * * * *